(12) United States Patent
Yazdani

(10) Patent No.: US 6,625,597 B1
(45) Date of Patent: Sep. 23, 2003

(54) INFORMATION EXCHANGE SYSTEM

(76) Inventor: Mobashar Yazdani, 63 Claremont Ave., Santa Clara, CA (US) 95051

( * ) Notice: Subject to any disclaimer, the term of this patent is extended or adjusted under 35 U.S.C. 154(b) by 292 days.

(21) Appl. No.: 09/625,138

(22) Filed: Jul. 25, 2000

(51) Int. Cl.[7] .............................................. G06F 17/30
(52) U.S. Cl. ........................... 707/3; 707/10; 707/104; 705/9
(58) Field of Search .............................. 705/26, 9, 500; 710/62; 707/3, 200; 716/5

(56) References Cited

U.S. PATENT DOCUMENTS

| | | | |
|---|---|---|---|
| 4,819,160 A | | 4/1989 | Tanka et al. .................... 707/4 |
| 4,931,929 A | * | 6/1990 | Sherman ...................... 705/500 |
| 5,202,977 A | | 4/1993 | Pasetes, Jr. et al. ............ 703/27 |
| 5,499,358 A | | 3/1996 | Nevarez ...................... 707/101 |
| 5,551,055 A | * | 8/1996 | Matheny et al. .............. 710/62 |
| 5,557,780 A | | 9/1996 | Edwards et al. .............. 703/27 |
| 5,721,911 A | | 2/1998 | Ha et al. ..................... 707/100 |
| 5,781,764 A | | 7/1998 | Degeneff et al. .............. 703/2 |
| 5,781,905 A | | 7/1998 | Awane et al. ................ 707/102 |
| 5,794,232 A | * | 8/1998 | Mahlum et al. ................ 707/3 |
| 5,802,518 A | | 9/1998 | Karaev et al. .................. 707/9 |
| 6,006,195 A | * | 12/1999 | Marchak et al. ................ 705/9 |
| 6,023,698 A | | 2/2000 | Lavey, Jr. et al. |
| 6,167,382 A | * | 12/2000 | Sparks et al. ................. 705/26 |

* cited by examiner

Primary Examiner—Kim Vu
Assistant Examiner—Gwen Liang

(57) ABSTRACT

A design information communication system having a design dictionary, design directory, and design data blocks is disclosed. The system may be used for communicating design attributes and values for various devices under design. The dictionary defines various attributes of the device. The directory identifies, or lists the required attributes to design the device. The data block provides values for the identified attributes. A plurality of dictionaries may be grouped as a dictionary repository. The dictionary repository may be contained by a server connected to a network such as the Internet.

3 Claims, 2 Drawing Sheets

INFORMATION EXCHANGE SYSTEM

BACKGROUND

The present invention relates to the art of communicating design information. More specifically, the present invention relates to the art of communicating design information over a network.

To design a large or complex device, many designers work together with each designer contributing to a portion of the design. Then, the contributed portions of the design are integrated into a single design by a system integrator. For example, to design a complex semiconductor device such as an ASIC (application specific integrated circuit) device, an integrator typically hires design vendors to submit designs for various blocks, or portions, of the ASIC device. Each of the design blocks is typically defined by identifying the design block's attributes and parameters, including, for example, physical size, electrical characteristics, and operating properties.

For the integrator and the vendors to communicate effectively, the design parameters and attributes must be clearly defined and understood by all of the parties. However, this is difficult because the integrator and the vendors may use different sets of attributes to describe a design block. Moreover, even if the integrator and the vendors use same sets of attributes to describe the design block, they may have diverging definitions for these attributes. Typically, the integrator, as a customer of the vendors' products and services, requires the vendors to agree to use the integrator's sets of attributes and their definitions. Then, the integrator's sets of attributes and their definitions are sent to the vendors. When the integrator's design attribute sets and definitions are updated, the updated sets and definitions are again communicated to each of the vendors. These communications lack standardized formats and methods.

Following the agreements regarding the design block attribute sets and their definitions, the integrator and the vendors must communicate design specifications for the design blocks. The design specifications include actual values for the attributes of the design blocks. However, there is no efficient solution for electronic transfer of design block specification. Ad hoc solutions to this problem exist; these ad hoc solutions typically employ commercial spreadsheet programs or databases for exchange of information based on predefined templates. These templates may be a simple attribute and value lists or indexes. Alternatively, these templates may include complex objects and metadata. The format and the contents of these ad hoc solutions and their templates vary widely from vendor to vendor and from project to project. Moreover, each time the attribute list change, entire spreadsheets or databases must be updated to accommodate the change.

Accordingly, there remains a need for a design information communication system that allows for efficient communications of designs and specifications between the system integrator and the vendors.

SUMMARY

These needs are met by the present invention. According to one embodiment of the present invention, a design information communication system includes a design dictionary. The design dictionary includes definition of various design attributes. The design information communication system may also include a design directory. The design directory identifies attributes for a design, and identifies a design dictionary in which the identified attributes are defined. Finally, the design information communication system may include design data block providing values for the identified attributes of the design directory.

The design dictionaries may be used for defining parameters and attributes for all the parties involved in the design. The design directory, typically defined by the integrator, may include the attributes of a particular design in a predefined format. The design data blocks may include actual values for the attributes for a particular design directory in the predefined format. Using the dictionaries and the directories, the integrator and the vendors have common definitions and the list of attributes required for a design. The vendors merely need to provide, to the integrator, the data blocks in a predefined, known format.

The invention may be implemented as a design information communication system including a dictionary repository server having at least one design dictionary defining design attributes. Connected to the server 102 may be a first client having a design directory identifying attributes for a design. The identified attributes may be defined by at least one design dictionary of the dictionary repository server. The design directory may identify at least one design dictionary of the dictionary repository server which defines the attributes.

The invention may be implemented as an article of manufacture having machine-readable storage. The storage may include encoded data structure for a design dictionary and a design directory.

Other aspects and advantages of the present invention will become apparent from the following detailed description, taken in conjunction with the accompanying drawings, illustrating by way of example, the principles of the present invention.

DETAILED DESCRIPTION

Figure 1:
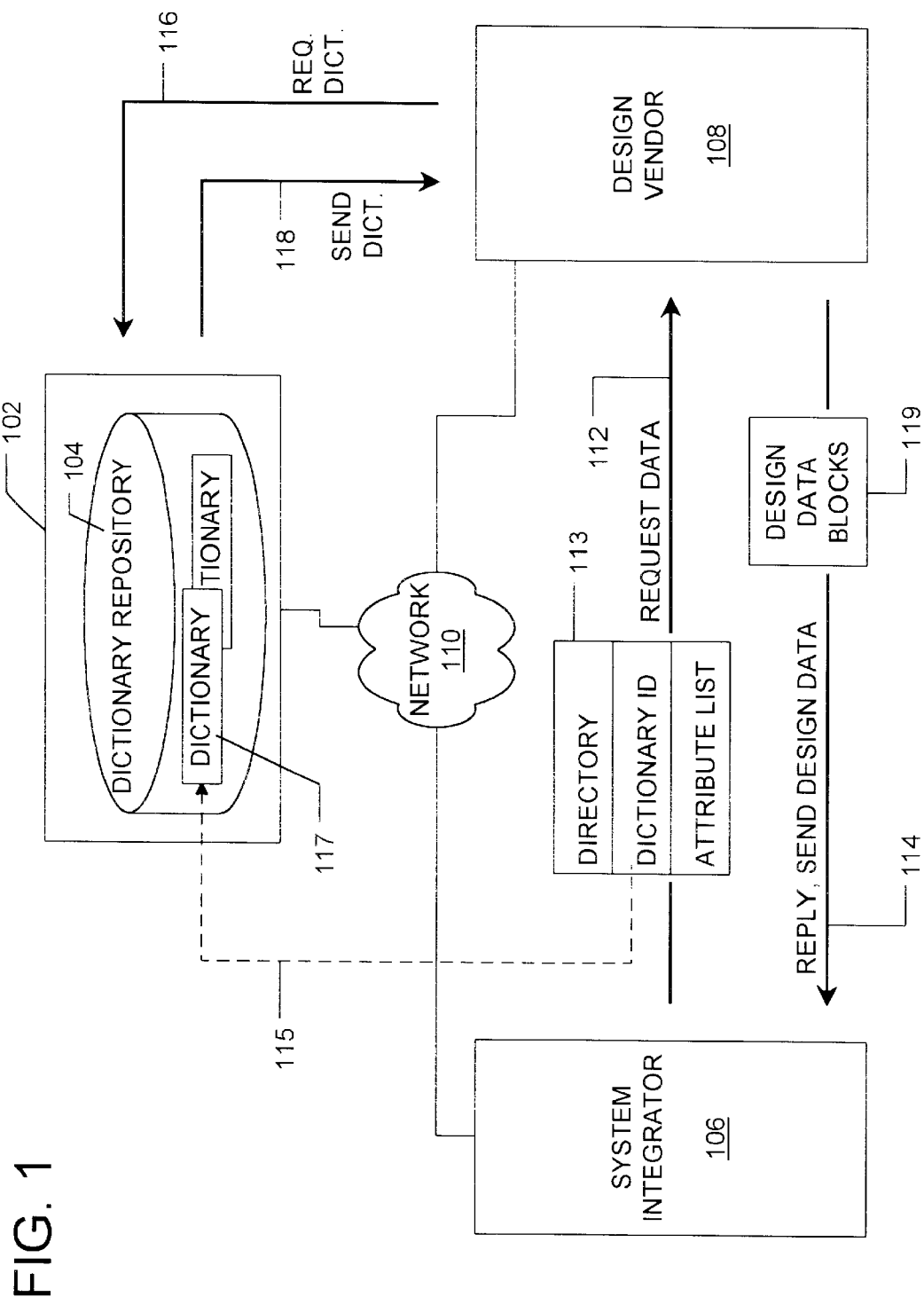
FIG. 1 is a simplified diagram illustrating logical components of a preferred embodiment of the present invention.

As shown in the drawings for purposes of illustration, the present invention is embodied in a system for communicating design information. The system includes a dictionary for defining design parameters and attributes, a directory for identifying attributes for a design, and data block for providing values for the identified attributes. The integrator and the vendors refer to the same dictionary for definitions of the parameters and attributes thereby eliminating the possibility of misunderstanding. The design directory lists the attributes of the design block; therefore, there can be no confusion as to the information required for the design block.

Referring to FIG. 1, a simplified diagram illustrating logical components of a preferred embodiment of the present invention is shown. A dictionary server 102 ("server") may be connected to a network 110. In one embodiment, the network 110 is the Internet and the server 102 is a computing machine operating as a file server or a web server connected to the Internet 110. The server 102 may include storage 104 containing a dictionary repository. A dictionary repository is a set of one or more dictionaries. A dictionary is preferably a file listing attributes and definitions of the listed attributes. The following is a sample dictionary format:

```
[DICTIONARY ID: NAME OR NUMBER IDENTIFICATION]
[Property 1 : Attribute 1 : Definition of Property 1 Attribute 1]
[Property 1 : Attribute 2 : Definition of Property 1 Attribute 2]
. . .
[Property 2 : Attribute 1 : Definition of Property 2 Attribute 1]
[Property 2 : Attribute 2 : Definition of Property 2 Attribute 2]
. . .
[Property i : Attribute j : Definition of Property i Attribute j]
. . .
[Property M : Attribute N : Definition of Property M Attribute N]
```

The following is a sample dictionary based on the sample dictionary format:

```
[DICTIONARY ID: CPU DICTIONARY 001 FTP.ACME.COM/DICT/CPU001.DIC
UPDATED 06/01/2000]
[Physical prop. : X-axis size : size in micrometers, lower left
corner = 0]
[Physical prop. : Y-axis size : size in micrometers, lower left
corner = 0]
[Electrical property : Vdd : power supply voltage]
[Electrical property : CLK : clock frequency in MHz]
```

Figure 2:
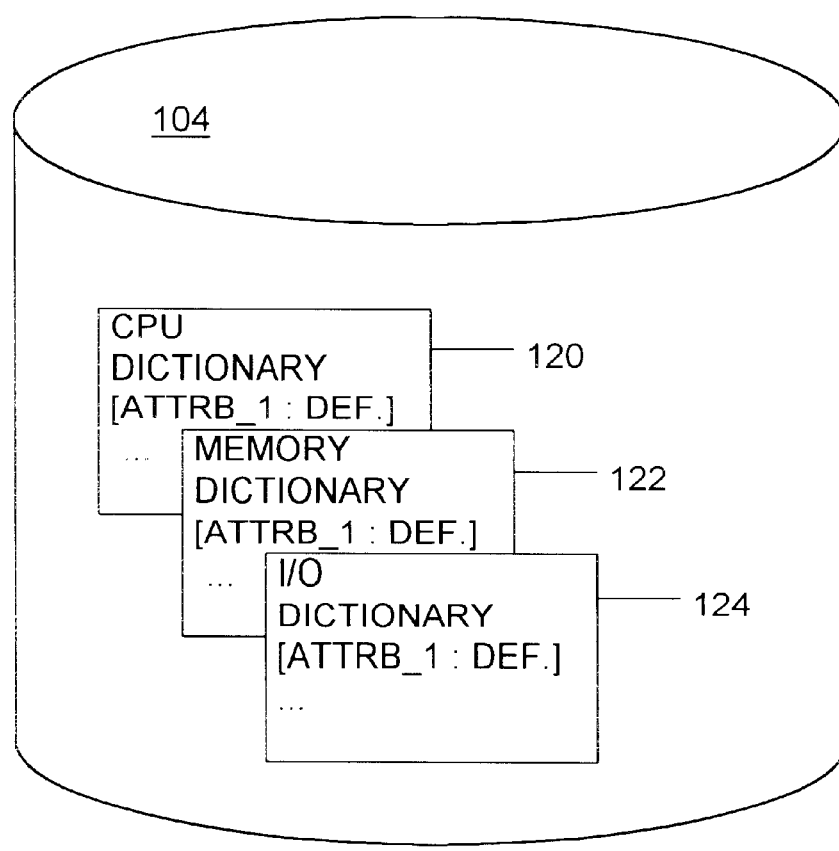
FIG. 2 is a diagram illustrating a dictionary repository in storage.

As indicated by the sample dictionary, a dictionary may include a dictionary id, identifying it from other dictionaries. The listed attributes may be grouped into properties or other sets. In the sample dictionary, attributes Vdd and CLK are grouped as Electrical Property. FIG. 2 illustrates a dictionary repository contained in the storage 104. In the illustration, for example, the storage 104 includes three dictionaries 120 (CPU Dictionary), 122 (Memory Dictionary), and 124 (Input/Output(I/O) Dictionary). Although it would be most useful to maintain the dictionaries in a repository, each dictionary is preferably a standalone file usable by itself The dictionary repository may hold a plurality of such dictionaries.

As illustrated, the dictionary id may include a uniform resource allocator (URL) address. If the network 110 is the Internet, then each of the dictionaries of the repository 104 may be assigned a URL address to facilitate access by vendors (represented by design vendor 108 in FIG. 1).

The present invention is not limited to the exact format of the sample dictionary and the sample dictionary format. In practice, a dictionary may include definitions for hundreds or thousands of attributes. Moreover, the dictionary will likely be much larger and more complex than the sample dictionary. The sample dictionary and the sample dictionary format are provided solely for the purposes of aiding the present disclosure. Another sample dictionary is disclosed as Appendix 1.

Referring again to FIG. 1, a system integrator 106 defines one or more directories, each of which identifies and lists attributes for a particular design block. The integrator 106 may also be connected to the server 102 via the network 110. Relative to the server 102, the integrator 106 may operate as a client to the server 102 over the network 110.

Each of the directories identifies the dictionary in which the listed attributes are defined. The following is a sample directory format:

```
[DIRECTORY ID: NAME OR NUMBER IDENTIFICATION]
[DICTIONARY ID: ID OF THE DICTIONARY DEFINING ATTRIBUTES LISTED IN
THIS DIRECTORY]
[Property 1 : Attribute 1]
[Property 1 : Attribute 2]
. . .
[Property 2 : Attribute 1]
[Property 2 : Attribute 2]
. . .
[Property i : Attribute j]
. . .
[Property M : Attribute N]
```

The following is a sample directory based on the sample directory format:

```
[DIRECTORY ID: CPU DESIGN XYZ]
[DICTIONARY ID: CPU DICTIONARY 001 FTP.ACME.COM/DICT/CPU001.DIC
UPDATED 06/01/2000]
[Physical prop. : X-axis size]
[Physical prop. : Y-axis size]
```

-continued

```
[Electrical property : Vdd]
[Electrical property : CLK]
```

As indicated by the sample directory, a directory may include a directory id which may also serve as the design block id. The attributes may be grouped into properties or other sets. In the sample, directory CPU DESIGN XYZ identifies four attributes—X-axis size, Y-axis size, Vdd, and CLK—for its design block. Typically, the integrator 106 would define a directory for each of design blocks. Then, the integrator 106 requests values for each of the identified design blocks from design vendors. This operation is illustrated as arrow 112. The request may be performed by sending a design directory, for example directory 113, to a design vendor 108. The directory lists the attributes of the design. As indicated by line 115, the directory 113 preferably identifies or points to a dictionary 117 in which the listed attributes are defined. Preferably, only the directory 113 needs to be sent. However, if the integrator 106 knows that the vendor 108 requires a copy of the dictionary (identified by the directory being sent), or if there has been a recent update to the dictionary, then the request 112 may include the dictionary 117 as well as the directory 113. Then the request file may be a concatenated directory and dictionary, for example:

(FTP) to retrieve the dictionary CPU001.DIC. The vendor 108 may retrieve the dictionary by making a request for the dictionary from the server 102 identified by the dictionary id. Operation 116. The server 102 then sends the requested dictionary to the vendor. Operation 118. The dictionary may be used by the vendor 106 to ensure that the integrator 106 and the vendor 108 are using same definitions for the design attributes identified by the directory. Here, the vendor 108 may function as another client in relation to the server 102.

In practice, the server 102 may be maintained by the integrator 106. In fact, they may reside in a single physical machine. However, the server 102 and the integrator 106 are illustrated separately in FIG. 1 to demonstrate the functional distinction between the server 102 and the integrator 106.

The present invention is not limited to the exact format of the sample directory and the sample directory format. In practice, a directory may include hundreds or thousands of attributes. Moreover, the directory will likely be much larger and more complex than the sample directory. The sample

```
[DIRECTORY ID: CPU DESIGN XYZ]
[DICTIONARY ID: CPU DICTIONARY 001 FTP.ACME.COM/DICT/CPU001.DIC
UPDATED 06/01/2000]
[Physical prop. : X-axis size]
[Physical prop. : Y-axis size]
[Electrical property : Vdd]
[Electrical property : CLK]
```

```
[DICTIONARY ID: CPU DICTIONARY 001 FTP.ACME.COM/DICT/CPU001.DIC
UPDATED 06/01/2000]
[Physical prop. : X-axis size : size in micrometers, lower left
corner = 0]
[Physical prop. : Y-axis size : size in micrometers, lower left
corner = 0]
[Electrical property : Vdd : power supply voltage]
[Electrical property : CLK : clock frequency in MHz]
```

In general, when only the directory is sent to a vendor, the vendor may obtain the dictionary (identified by the directory) from the dictionary server 102. For instance, using the dictionary id FTP.ACME.COM/DICT/CPU001.DIC from the sample directory, the vendor 108 may use the World Wide Web and the File Transfer Protocol directory and the sample directory format are provided solely for the purposes of aiding the present disclosure. Another sample directory is disclosed as Appendix 2.

The vendor 108 responds 114 to the request 112 by formulating and sending a data block 119 for the directory. The following is a sample data block format:

```
[DATA BLOCK ID: NAME OR NUMBER IDENTIFICATION]
[DIRECTORY ID: ID OF THE DIRECTORY FOR TO THIS DATA BLOCK BELONGS]
[Property 1 : Attribute 1 : value of property 1 attribute 1]
[Property 1 : Attribute 2 : value of property 1 attribute 2]
...
[Property 2 : Attribute 1 : value of property 2 attribute 1]
[Property 2 : Attribute 2 : value of property 2 attribute 2]
...
[Property i : Attribute j : value of property i attribute j]
...
[Property M : Attribute N : value of property M attribute N]
```

The following is a sample data block based on the sample data block format:

```
[DATA BLOCK ID: DATA BLOCK 001]
[DIRECTORY ID: CPU DESIGN XYZ]
[Physical prop. : X-axis size : 4000]
[Physical prop. : Y-axis size : 3000]
[Electrical property : Vdd : 2.6]
[Electrical property : CLK : 100]
```

As indicated by the sample data block, a data block preferably includes actual values for the design specified by its corresponding directory. The vendor 108 replies 114 to the integrator by sending 114 the data blocks prepared in response to the request 112. Multiple data blocks may be prepared by the vendor 108 and sent to the integrator 106. Preferably, only the data blocks are sent to the integrator 106. However, the corresponding directory may also be sent as a confirmation. Then, the reply may appear as follows:

```
[DIRECTORY ID: CPU DESIGN XYZ]
[DICTIONARY ID: CPU DICTIONARY 001 FTP.ACME.COM/DICT/CPU001.DIC
UPDATED 06/01/2000]
[Physical prop. : X-axis size]
[Physical prop. : Y-axis size]
[Electrical property : Vdd]
[Electrical property : CLK]
```

```
[DATA BLOCK ID: DATA BLOCK 001]
[DIRECTORY ID: CPU DESIGN XYZ]
[Physical prop. : X-axis size : 4000]
[Physical prop. : Y-axis size : 3000]
[Electrical property : Vdd : 2.6]
[Electrical property : CLK : 100]
```

```
[DATA BLOCK ID: DATA BLOCK 002]
[DIRECTORY ID: CPU DESIGN XYZ]
[Physical prop. : X-axis size : 4500]
[Physical prop. : Y-axis size : 2500]
[Electrical property : Vdd : 2.6]
[Electrical property : CLK : 100]
```

The sample reply includes the directory and two design data blocks 001 and 002. The two design blocks provide two alternative designs from which the integrator 106 may select in its effort to design the device under development. This may be useful because a range of data blocks may be considered by the integrator, the design blocks having slightly different values for the attributes of the directory.

Using the structures of the present invention, it would be a simple matter to take a "snapshot" of any design block at any state of development by merely saving its directory, dictionary, and data block. For example, the following information may be saved to take a snapshot of a design block:

```
[DIRECTORY ID: CPU DESIGN XYZ]
[DICTIONARY ID: CPU DICTIONARY 001 FTP.ACME.COM/DICT/CPU001.DIC
UPDATED 06/01/2000]
[Attribute List . . .]
```

```
[DICTIONARY ID : CPU DICTIONARY 001 FTP.ACME.COM/DICT/CPU001.DIC
UPDATED 06/01/2000]
[Attributes and Definitions]
```

```
[DATA BLOCK ID: DATA BLOCK 001]
[DIRECTORY ID: CPU DESIGN XYZ]
[Values for the Attributes . . .]
```

Such data snapshots may be suitable for archival, tracking, searching the design data.

Further, incremental development of various design blocks becomes easier. This is because incremental designs would be reflected by new directories which may include only incremental changes to the previous versions. For these directories, the data blocks from prior directories may be copied and updated instead of new data blocks being generated.

The present invention is not limited to the exact format of the sample design blocks and the sample design block format. In practice, a design block may include values for hundreds or thousands of attributes. Moreover, the design blocks will likely be much larger and more complex than the sample design blocks. The sample design blocks and the sample design block format are provided solely for the purposes of aiding the present disclosure. Another sample design block is disclosed as Appendix 3.

From the foregoing it will be appreciated that the design communication system of the present invention allows for efficient communication of design specifications and exchange of data between system integrator and design vendors. Although specific embodiments of the present invention have been described and illustrated, the invention is not to be limited to the specific forms or arrangements of parts so described and illustrated. The invention is limited only by the claims.

APPENDIX 1

IP_DICT
Identification <
  Supplier < < SName: The supplier who will deliver the part > >
  Originator < < oname: Name of the design or part orignator > >
  Class < < CName: Catagory of the component > < Function: Function the part performs > >
  vcname < < name: Name of the Component > >
  Revision < < Revision: Revision number of the design/component > >
  Version < < Version: Design Version > >
  Part Number < < Pnumber: company specific Design block/part number > >
  duns number < < dnumber: Duns number if none use 00001 > >
  Exchange Number < < exnumber: The number of time the same information is sent > > >
Taxonomy <
  Type < < Type: Type of SIP, ASSP, Component, embedded > >
  Class < < Class: Class it belongs too, CPU, DSP, I/O etc. > >
  Function < < Function: It's function e.g data conversion, level shifter etc. > >
  Application < < Application: Where it can be applied e.g > >
  Use < < use: Where it has been used > > >
General <
  Source < < Dictionary: Name of the dictionary used > < Version: Version number > < Address: Dictionary Address > < Type: embedded or stand-alone > >
  Location < < Loc: Address of the company, Name, Street, Zip, Country > >
  Supplier ID < < Supplier ID: Company specific ID nagociated > >
  Date < < Date: Date of orignation or update of information as yyyymmdd > > >
Technical <
  Release Dates < < Engineering sample (yyyy-mm-dd): date of engineering sample available > < Customer sample (yyyy-mm-dd): date of customer sample available > < Manufacturing release (yyyy-mm-dd): date of manufacturing release > < End of life (yyyy-mm-dd): end of life date > >
  Module technology < < module type: SIMM, DIMM, SO-DIMM, RIMM, SO-RIMM, DDR DIMM > < total size (MB): enter value in MB > < speed: enter as PC133-333-520 or PC1600,PC2100 or PC600,PC700, PC800 > < based DRAM density (Mb): enter DRAM density in Mb > < based DRAM die rev: enter DRAM die Revision > < ECC or Non-ECC: enter ECC or non-ECC > < Unbuffered/Registered: enter module type as REG or UNB > < Single/Double sided: enter module type as SS or DS > < PCB version: The version of the PCB > < Assembly location: Location of Assembly operation > < Number of pins: number of pins in the module > < comments field: comments > > >
Internal qualification data <
  ID Numbers < < DRAM or module: module or component > < DRAM or module part number: p/n > < MTC ID: MTC qualification ID > < MTC Qual Status: MTC to enter the status QUALIFIED/COND QUAL/DISQUALIFIED/PENDING > >
  DRAM/module < < AC characteristics table: attach file with AC test data > >
  Reliability < < High Temperature Operating Life (HTOL): hr > < Low Temperature Operating Life (LTOL): hr > < ESD: all pins, volts > < Vdd overvoltage latch up: all pins, V > < Dielectric Integrity Test Done: V > >
  Thermal < < Thermal Impedance: Thermal Impedence > > >

APPENDIX 2

IP_DIR
Identification <
  Supplier < SName >
  Originator < oname >
  Class < CName: Function >
  vcname < name >
  Revision < Revision >
  Version < Version >
  Part Number < Pnumber >
  duns number < dnumber >
  Exchange Number < exnumber > >
Taxonomy <
  Application < Application >
  Class < Class >
  Type < Type >
  Function < Function >
  Use < use > >
General <
  Source < Dictionary: Version: Address: Type >
  Location < Loc >
  Supplier ID < Supplier ID >
  Date < Date > >
Technical <
  Release Dates < Engineering sample (yyyy-mm-dd): Manufacturing release (yyyy-mm-dd): Customer sample (yyyy-mm-dd): End of life (yyyy-mm-dd) >
  Module technology < module type: total size (MB): speed: based DRAM density (Mb): based DRAM die rev: ECC or Non-ECC: Unbuffered/Registered: Single/

Double sided: PCB version: Assembly location: Number of pins: comments field > > Internal qualification data <

DRAM/module < AC characteristics table >

Reliability < High Temperature Operating Life (HTOL): Low Temperature Operating Life (LTOL): ESD: Vdd overvoltage latch up: Dielectric Integrity Test Done >

Thermal < Thermal Impedance > >

APPENDIX 3

IP_DATA

Identification <

Class < < CName: DRAM > < Function: Memory > >

Originator < < OName: Supplier contact > >

Supplier < < SName: Supplier > >

VCName < < Name: A value for Name > >

Version < < Version: A value for Version > >

Revision < < Revision: A value for Revision > >

DUNS Number < < DNumber: 00001 > >

Part Number < < PNumber: A value for PNumber > >

Exchange Number < < ExNumber: A value for ExNumber > > >

Taxonomy <

Type < < Type: Module > >

Class < < Class: Memory > >

Application < < Application: Computer Products > >

Function < < Function: Memory > >

Use < < use: Memory > > >

General <

Source < < Dictionary: HP_DRAM > < Version: 1 > < Address: None > < Type: Embedded > >

Supplier ID < < Supplier ID: dummy ID > >

Location < < Loc: dummy location > >

Date < < Date: dummy date > > >

Technical <

Module technology < < module type: dummy value > < total size (MB): dummy value > < speed: dummy value > < based DRAM density (Mb): dummy value > < based DRAM die rev: dummy value > < ECC or Non-ECC: dummy value > < Unbuffered/Registered: dummy value > < Single/Double sided: dummy value > < PCB version: dummy value > < Assembly location: dummy value > < Number of pins: dummy value > >

Release Dates < < Customer sample (yyyy-mm-dd): dummy value > < End of life (yyyy-mm-dd): dummy value > < Engineering sample (yyyy-mm-dd): dummy value > < Manufacturing release (yyyy-mm-dd): dummy value > > >

END_IP_BLOCK

What is claimed is:

1. A design information communication system comprising:

design dictionary defining design attributes;

design directory identifying attributes for a design and identifying a design dictionary in which said identified attributes are defined; multiple design dictionaries; and design data block providing values for said identified attributes of said design directory wherein said design data block defines an ASIC (application specific integrated circuit) device.

2. A design information communication system comprising:

dictionary repository server having at least one design dictionary defining design attributes; and first client, connected to said dictionary repository server, having a design directory identifying attributes for a design, said attributes defined by at least one design dictionary of said dictionary repository server, and said design directory identifying at least one design dictionary of said dictionary repository server wherein said first client requests values corresponding for said attributes from a second client, connected to said first client and connected to said dictionary repository server.

3. The system recited in claim 2 further comprising a network connecting said dictionary repository server having multiple dictionaries, said first client, and said second client.

* * * * *